United States Patent
Furukawa et al.

(10) Patent No.: US 6,937,114 B2
(45) Date of Patent: Aug. 30, 2005

(54) SURFACE ACOUSTIC WAVE DEVICE, ELECTRONIC COMPONENT USING THE DEVICE, AND COMPOSITE MODULE

(75) Inventors: Mitsuhiro Furukawa, Hyogo (JP);
Kiyoharu Yamashita, Osaka (JP);
Hiroshi Kurotake, Kyoto (JP);
Hiroyoshi Sekiguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/469,482

(22) PCT Filed: Dec. 25, 2002

(86) PCT No.: PCT/JP02/13544

§ 371 (c)(1),
(2), (4) Date: Aug. 27, 2003

(87) PCT Pub. No.: WO03/058813

PCT Pub. Date: Jul. 17, 2003

(65) Prior Publication Data

US 2004/0070313 A1 Apr. 15, 2004

(30) Foreign Application Priority Data

Dec. 28, 2001 (JP) ........................................ 2001-400139
May 13, 2002 (JP) ........................................ 2002-136672

(51) Int. Cl.$^7$ .......................... H03H 9/145; H03H 9/25; H03H 9/64
(52) U.S. Cl. ...................... 333/154; 333/193; 310/364; 310/313 B
(58) Field of Search .............................. 333/193–196, 333/150–155; 310/313 B, 364

(56) References Cited

U.S. PATENT DOCUMENTS 6,271,617 B1 * 8/2001 Yoneda et al. .......... 310/313 D
6,686,675 B2 * 2/2004 Koshido ...................... 310/364
6,791,236 B1 * 9/2004 Abramov ................ 310/313 B

FOREIGN PATENT DOCUMENTS

| JP | 09046168 A | 2/1997 |
|---|---|---|
| JP | 09-148373 A | 6/1997 |
| JP | 09153755 A | 6/1997 |
| JP | 11-74751 A | 3/1999 |
| JP | 2001-085968 A | 3/2001 |
| JP | 2001-094383 A | 4/2001 |
| JP | 2001-168671 A | 6/2001 |
| JP | 2002-217672 | 8/2002 |

OTHER PUBLICATIONS

International Search Report corresponding to application No. PCT/JP02/13544 dated Mar. 25, 2003.
English translation of PCT/ISA/210, dated Mar. 25, 2003.

* cited by examiner

Primary Examiner—Barbara Summons
(74) Attorney, Agent, or Firm—RatnerPrestia

(57) ABSTRACT

A surface acoustic wave device includes a piezoelectric substrate and an electrode provided on the substrate. The electrode includes a first metal layer provided on the piezoelectric substrate and having a trapezoid shape in the cross section and a second metal layer provided over the piezoelectric substrate at the same position as the first metal layer over the piezoelectric substrate. By controlling the shape of side surfaces of the electrode, the surface acoustic wave device hardly vary in a propagation frequency.

57 Claims, 10 Drawing Sheets

SURFACE ACOUSTIC WAVE DEVICE, ELECTRONIC COMPONENT USING THE DEVICE, AND COMPOSITE MODULE

This Application is a U.S. National Phase application of PCT International Application PCT/JP02/113544.

TECHNICAL FIELD

The present invention relates to a surface acoustic wave device for use in a communications apparatus, and to an electronic apparatus including the employing the surface acoustic device.

BACKGROUND ART

Surface acoustic wave devices are generally manufactured through forming metal layers over the surface of a piezoelectric substrate of a wafer form by vapor deposition, coating the metal layers with a resist, subjecting them to exposure and development process, dry etching the metal layers to shape a desired pattern of an electrode, and slicing them into chips.

Such a method allows the electrode to have a rectangular shape in its cross section. Each side surface of the cross section extends substantially perpendicular to the piezoelectric substrate as is configured sharply. Having its side surfaces being sharp, the electrode may reflect surface acoustic waves, thus hardly providing a desired frequency response.

FIG. 14 illustrates a conventional surface acoustic wave device 140 disclosed in Japanese Patent Laid-Open Publication No. 9-46168 for overcoming the above drawback. An electrode 142 on a piezoelectric substrate 141 has a moderate shape in its cross section having each side surface rounded and can thus attenuate the reflection of surface acoustic waves at the side surface, hence ensuring a desired frequency response.

A propagation frequency of a surface acoustic wave device is generally determined by the distance between comb electrodes and by the thickness of electrode layers. The comb electrodes can have the distance and the thickness accurately by a photo-lithography technique.

If having an excessively-large thickness or material density with the distance remaining uniform, the electrode provides a low propagation frequency. More particularly, if being heavy, the electrode may interrupt oscillation of the piezoelectric substrate, hence lowering the frequency.

A device having the electrode having a cross section having the round shape in a direction perpendicular to the piezoelectric substrate can suppress the reflection of surface acoustic waves on its sides. However, the shape cannot be determined, thus providing variations in its shape, size, and mass. The propagation frequency of the conventional surface acoustic wave device hardly be uniform accordingly.

Also, If the electrodes are contaminated at the surfaces with electrically conductive impurities during a surface mounting process or a packaging process of the device, the conventional surface acoustic device may be declined in the properties and short-circuited.

FIG. 15 illustrates another surface acoustic wave device for overcoming the above drawback as disclosed in Japanese Patent Laid-Open Publication No. 9-153755. An electrode 102 is formed on a piezoelectric substrate 101, and the electrode and a surface of the piezoelectric substrate 101 are covered with an insulating layer 103 together. The insulating layer 103 can prevent the surface of the surface acoustic wave device from short-circuit and electrically conductive impurities.

However, when the insulating layer 103 repeats to be pulled and pushed due to thermal expansion and compression, such as heat cycle, the layer may receive a significant stress and deteriorate due to a difference between respective thermal expansion coefficients of materials adjoining each other. Since the insulating layer 103 simply covers the electrodes 102 and the piezoelectric substrate 101, a bonding strength to the electrodes 102 and the piezoelectric substrate 101 may easily decline and be detached, hence resulting in the deterioration or short-circuit.

If the insulating layer 103 is thick for improving its physical strength, overall loss in the conventional surface acoustic wave device increases. If the layer 103 is thin, the insulating layer 103 may be detached while the loss in the conventional surface acoustic wave device is small.

SUMMARY OF THE INVENTION

A surface acoustic wave device includes a piezoelectric substrate and an electrode provided on the substrate. The electrode includes a first metal layer which is provided on the piezoelectric substrate and has a trapezoid shape in its cross section and a second metal layer provided over on the piezoelectric substrate at the same position as the first metal layer.

Since having a side surface in a cross section controlled, the surface acoustic wave device can hardly vary in its propagation frequency.

DESCRIPTION OF THE PREFERRED EMBODIMENTS (Embodiment 1)

Figure 1:
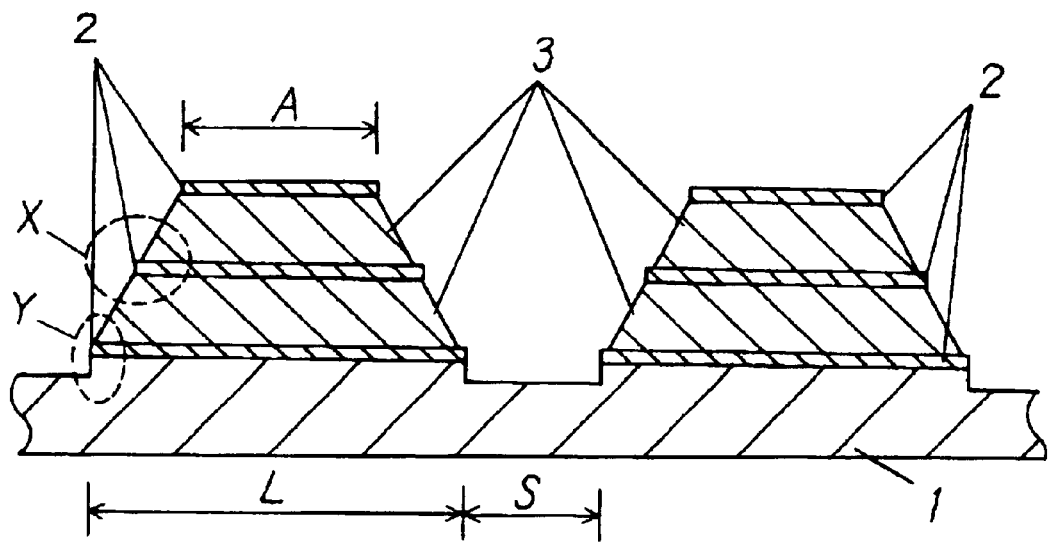
FIG. 1 is a cross sectional view of an electrode of a surface acoustic wave device according to exemplary embodiment 1 of the present invention.

FIG. 1 is a cross sectional view of an electrode of a surface acoustic wave device according to exemplary embodiment 1 of the present invention.

As shown in FIG. 1, a Ti layer 2 and an Al layer 3 are provided on a piezoelectric substrate 1.

Electrodes of a conventional surface acoustic wave device are controlled in their dimensions and particularly thickness for providing a desired propagation frequency, but are not controlled in the shapes of side surfaces of the electrodes. If the thickness or density of the electrodes is too large, the frequency accordingly decreases in the device having the same distance between the electrodes. More specifically, if the electrodes are heavy, the electrodes may disturb oscillation of the piezoelectric substrate, hence decreasing the frequency. Even if the thickness of the electrodes and the distance between the electrodes are appropriately controlled, any difference in the mass between the electrodes wobbles the propagation frequency.

The weight of the electrodes varies according not only to the thickness or density of the electrodes but also to the shape, particularly, to the smoothness of side surfaces of the electrodes. The variations of the propagation frequency can be reduced through controlling the weights of the electrodes by controlling the shape and the smoothness of the side surfaces of the electrodes.

A procedure of manufacturing the surface acoustic wave device of this embodiment will be explained.

The Ti layer 2 having a predetermined thickness is formed on the piezoelectric substrate 1 made of a $LiTaO_3$ wafer by, for example, sputtering of metal, such as Ti.

Then, the Al layer 3 having a predetermined thickness is formed on the Ti layer 2 by, for example, sputtering of metal, such as Al. These processes are repeated to provide Ti layers 2 and Al layers 3 placed alternately and to provide a Ti layer 2 at the top.

The Ti layer 2 and the Al layer 3 may be arranged in a reverse order or modified in the thickness if necessary.

A resist is then applied on the metal layers, is exposed to light for development through a photo mask with an appropriate machine, such as a stepper, and is selectively removed to form a desire pattern of the electrodes.

Then, comb electrodes, reflector electrodes, and pad electrodes are formed by, e.g., dry-etching the electrodes. The dry etching is performed under such specific operating conditions that the electrodes are configured to a trapezoid shape in the cross section having the bottom extending longer than the top, and its side surfaces are arranged substantially linear and smooth.

The dry etching may be conducted by an inductively-coupled plasma (ICP) method using heavy ions of chloric radical and $BCl_2^+$, where the piezoelectric substrate is loaded with a high-frequency bias and can thus be etched efficiently.

In order to have the trapezoid shape in the cross section of the electrodes having the bottom extending longer than the top, the ratio of the radical and the heavy ions are substantially 1:1, and the high-frequency bias is 100 W. This allows metal particles once spread out to be accumulated at a portion near the piezoelectric substrate, hence providing the trapezoid shape of the cross section having the bottom extending longer than the top.

Then, after the resist is removed, the wafer is divided into chips, i.e., surface acoustic wave devices 21 by, for example, a dicing machine.

An electronic apparatus is then fabricated using the surface acoustic wave device 21.

Figure 8:
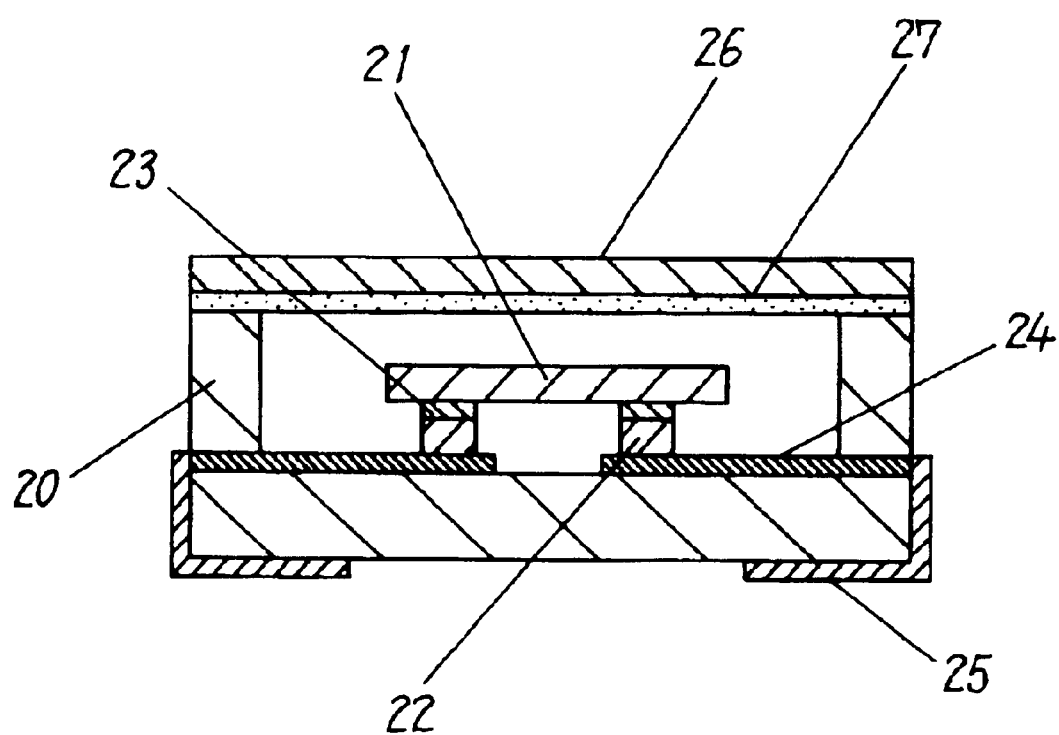
FIG. 8 is a cross sectional view of an electronic apparatus according to embodiment 1.

FIG. 8 is a cross sectional view of the electronic apparatus including the surface acoustic wave device 21. The electronic apparatus includes a base 20 having a center recess formed therein, the surface acoustic wave device 21, bumps 22, pad electrodes 23 provided on the surface acoustic wave device 21, lead electrodes 24 provided at the recess of the base 20, terminal electrodes 25 provided on the outer side of the base member 20, a cover 26, and an adhesive 27 provided on a surface of the cover 26 towards the base 20.

The bumps 22 made of electrically conductive metal, such as gold, are connected to the pad electrodes 23 of the surface acoustic device 21. Then, the surface acoustic wave device 21 is placed so that a functional side of the device faces down to the base 20 including the lead electrodes 24 and the terminal electrodes 25. The bumps 22 contacts the lead electrodes 24 directly. With an ultrasonic wave, the bumps 22 are joined or mounted to the base 20. Next, the cover 26 carrying the adhesive 27, such as a solder, is placed on the surface of the base 20 having the surface acoustic wave device 21 mounted thereon. The adhesive 27 faces the base 20. Then, they are heated for joining and sealing, thus providing the electronic apparatus.

The surface acoustic wave device 21 may be mounted by any applicable technique, such as wire bonding. The adhesive 27 may contain gold, plating material, or brazing material containing gold. Wirings for connecting the bumps to external terminals may be provided in the base.

The lowermost layer of the electrode containing metal, such as Ti or Ta provides a metal layer having excellent orientation on the piezoelectric substrate 1. A metal, such as Ti or Ta, is stacked on Al, thus increasing a withstand power of the surface acoustic wave device 21.

The uppermost layer of the electrode containing metal, such as Ti or Ta, protects the outer surface of the electrode from injury during the dry-etching process. Since the electrodes are fabricated uniformly in the shape, size, and mass, the propagation frequency of the surface acoustic wave device 21 can hardly varies. Since Ti or Ta in the uppermost layer is chemically more stable than Al or Al alloy in the layer beneath the uppermost layer, the electronic apparatus has a stable resistance against climate, particularly against moisture.

The electrode has the cross section arranged of a trapezoid shape having the bottom extending longer than the top, and has the side surfaces arranged substantially linear and smooth without significant undulations. That is, an undesired side-etching effect produced during the dry-etching process is reduced to make the shape and size of the electrode uniform and to reduce the difference in the weight between the electrodes, thus preventing the propagation frequency of the surface acoustic wave device 21 from varying.

For implementing the shape and size of the electrodes, metals or alloys which are different in dry etching rate are combined. In addition, the shape and size of the electrodes is obtained by optimizing operating conditions for the etching process according to the metals or alloys. The metals or alloys have different characteristics of solidification in which their particles spread out by vaporization or electric charging during the dry etching process are re-aggregated to become a solid.

According to embodiment 1, the metal is Al for easy dry-etching process, and may be other metal or alloy, such as Al—Cu alloy, which can easily be dry-etched. Ti selected as hardly-etched material of this embodiment may be replaced by other metal or alloy, such as Ta, which can hardly be dry-etched.

The electrodes can have substantially linear, smooth side surfaces by selecting materials, designing their optimum shape and size, and determining the operating conditions appropriately for the dry-etching process.

Figure 2:
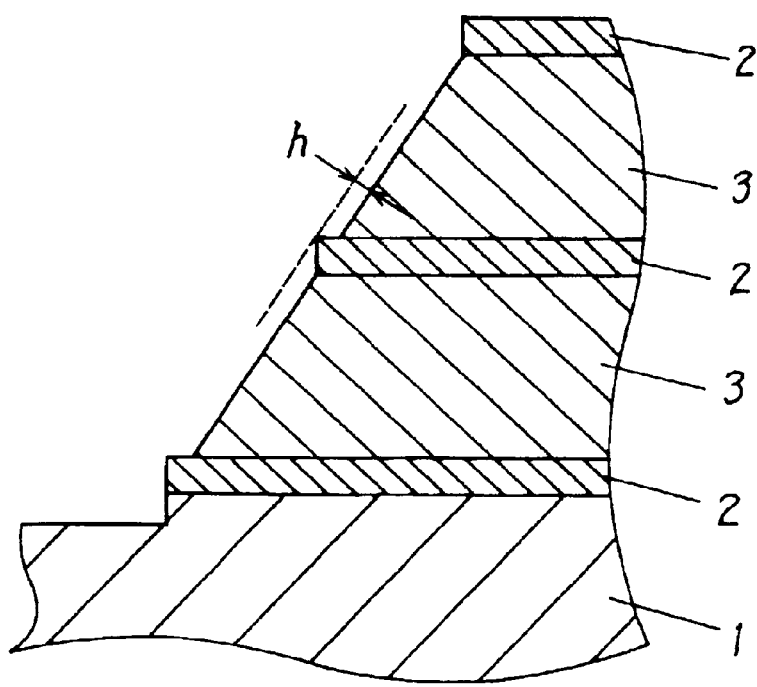
FIG. 2 is an enlarged view of the electrode according to embodiment 1.

FIG. 2 is an enlarged view of a portion X of the electrodes in FIG. 1. The surface acoustic wave device includes the Ti layers 2 and the Al layers 3

An interlayer difference or projection of the Ti layer 2 extending perpendicularly to a surface of the Al layer 3 are defined by an interlayer difference (h). The interlayer difference (h) is about 1 nm according to embodiment 1. The interlayer difference (h) preferably is not greater than 5 nm for reducing variations in the propagation frequency of the surface acoustic wave device 21. Similarly, an undulation or bump of a side of the electrode is not greater than 5 nm. If the undulation or bump of the side of the electrodes is greater than 5 nm, the electrodes may vary in weight, hence creating an unnegligible effect. More specifically, the propagation frequency of the surface acoustic wave device 21 becomes not uniform, thus causing an undesired fault. The undulation or bump is not only a locally prominent projection or dent but also a wavy surface throughout the sides.

The interlayer difference (h) represents the maximum difference, if the sides have different amount of differences.

A portion of the piezoelectric substrate 1 where the electrodes are not formed is dry-etched. When the etching in the piezoelectric substrate 1 is too deep, i.e. the electrode have large thicknesses apparently, the propagation frequency of the surface acoustic wave device 21 may shift to lower end, thus varying unnegligibly. Accordingly, an etched amount in the piezoelectric substrate 1 is preferably small.

Figure 3:
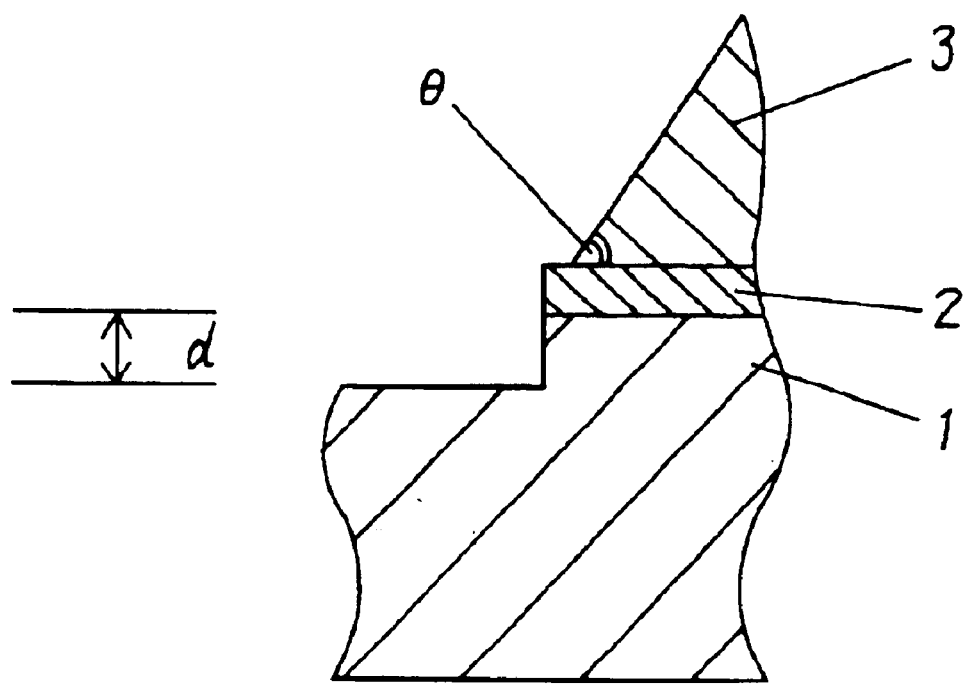
FIG. 3 is an enlarged view of the electrode according to embodiment 1.

FIG. 3 is an enlarged view of a region Y of the electrodes shown in FIG. 1. The etched amount of the piezoelectric substrate 1 is defined by an etched depth (d), i.e., a distance from the surface of the piezoelectric substrate 1 where the electrodes are provided to the exposed surface of the piezoelectric substrate 1 where the electrodes are not formed. The inclination of each side surface of the electrode is defined by an inclination angle θ between the upper surface of the lowermost electrode layer and the side of the electrode layer directly above the lowermost electrode layer on the piezoelectric substrate 1. The etched depth (d) is 5 nm according to embodiment 1 and may preferably be as small as not greater than 10 nm. If the etched depth (d) is greater than 10 nm, the depth functions as an actual increase of the thickness of the electrodes, as the sum of the thickness and the depth, and can hardly be negligible. As the result, the propagation frequency of the surface acoustic wave device 21 may shifts to the lower end, thus varying unnegligibly.

The side surfaces of the electrodes may be injured more or less during the dry etching process. The operating conditions for the dry etching process are determined to have the bottom of the trapezoid shape of the cross section of the electrodes extending longer than the top of the shape. This arrangement prevents the electrodes from physical injury during the dry etching process, hence reducing the undulation or bump of each side surface, particularly the undulation or bump of the uppermost layer of the electrodes. Accordingly, the electrodes are made uniform in the shape and size, the difference of weights of the electrodes can be minimized, thus eliminating variations in the propagation frequency of the surface acoustic wave device 21.

As shown in FIG. 1, the length (L) of the bottom of the trapezoid shape in the cross section of the electrodes and the distance (S) between the electrodes satisfy that L/(L+S) ranges from 0.59 to 0.61 according to embodiment 1. While L/(L+S) staying in the above range, the electrodes are made uniform in the shape and size. Accordingly, since the electrodes are less different in the weight, the surface acoustic wave device 21 can hardly vary in the propagation frequency. L/(L+S) may preferably range from 0.58 to 0.65 in view of variation. When L/(L+S) is smaller than 0.58 or larger than 0.65, the smoothness on the side surfaces of the electrodes can decline, hence increasing the difference in the mass between the electrodes and then changes the propagation frequency of the surface acoustic wave device 21.

As shown in FIG. 1, the length A of the top of the trapezoid shape in the cross section of the electrodes and the length L satisfy that A/L ranges from 0.82 to 0.85. While A/L staying in the above range, the electrodes are made uniform in the shape and size. Accordingly, since the electrodes are less different in the weight, the surface acoustic wave device 21 can hardly vary in the propagation frequency. The electrodes having the bottom of the trapezoid shape in the cross section extending longer than the top of the shape may preferably satisfy that A/L ranges from 0.8 to 0.9 with an allowance of ±0.004 from the center value.

If A/L is less than 0.8 or greater than 0.9, the smoothness of the side surfaces of the electrodes declines, hence increasing the difference in the mass between the electrodes, and the propagation frequency of the surface acoustic wave device 21 accordingly varies.

Alternatively, the cross section of the electrodes may be arranged of an inverted trapezoid shape having the bottom extending shorter than the top. In this case, A/L may range preferably from 1.1 to 1.3 with an allowance of ±0.004 from the center value.

Moreover, the electrodes is shaped symmetrical between the left and the right, hence making the reflection of propagated waves uniform and increasing the accuracy of their shape. Accordingly, the propagation frequency of the surface acoustic wave device 21 can rarely vary.

The inclination angle (θ) of the side of the electrodes shown in FIG. 3 ranges from 73 to 75 degrees. The inclination angle (θ) staying within the range allows the electrodes to be uniform in the shape and size. Since the difference in weight between the electrodes is reduced, the surface acoustic wave device 21 can hardly vary in the propagation frequency. The inclination angle (θ) may range from 70 to 80 degrees in view of any variation. If the inclination angle (θ) is smaller than 70 degrees or greater than 80 degrees, the smoothness of the side surfaces of the electrodes may decline, thus increasing the difference in mass between the electrodes. As the result, the propagation frequency of the surface acoustic wave device 21 can vary significantly.

The electrodes according to embodiment 1 are fabricated from a layered assembly of the metals having the dry etching rate different from each other. This arrangement allows easily-etched layers to be arranged to a trapezoid shape in the cross section having the bottom extending longer than the top, and allows hardly-etched layers to be shaped of a rectangular in the cross section. Since any difference between the trapezoid shape and the rectangular shape is reduced, the electrodes have the side surfaces substantially smooth. Accordingly, the electrodes are made uniform in the shape and size, and their difference in the weight is reduced, thus allowing the surface acoustic wave device 21 to hardly vary in the propagation frequency.

Even when the electrodes are optimized in the distance between any two of them and in the thickness for having a rectangular or trapezoid shape in the cross section, the difference in the weight between the electrodes is inevitable in the prior art. As the result, the propagation frequency varies while its average is properly controlled. According to this embodiment, however, the electrodes are preferably arranged in the shape and size to have a quality of smoothness on the side surfaces in addition to optimizing their weight, thickness, and density. Accordingly, the propagation frequency of the surface acoustic wave device can hardly vary.

Also, the greater the mass of their metal materials, the larger the difference in the weight between the electrodes. In order to reduce the difference in the weight between the electrodes, the electrodes may be made of the metal materials which are lower in the mass.

Figure 4:
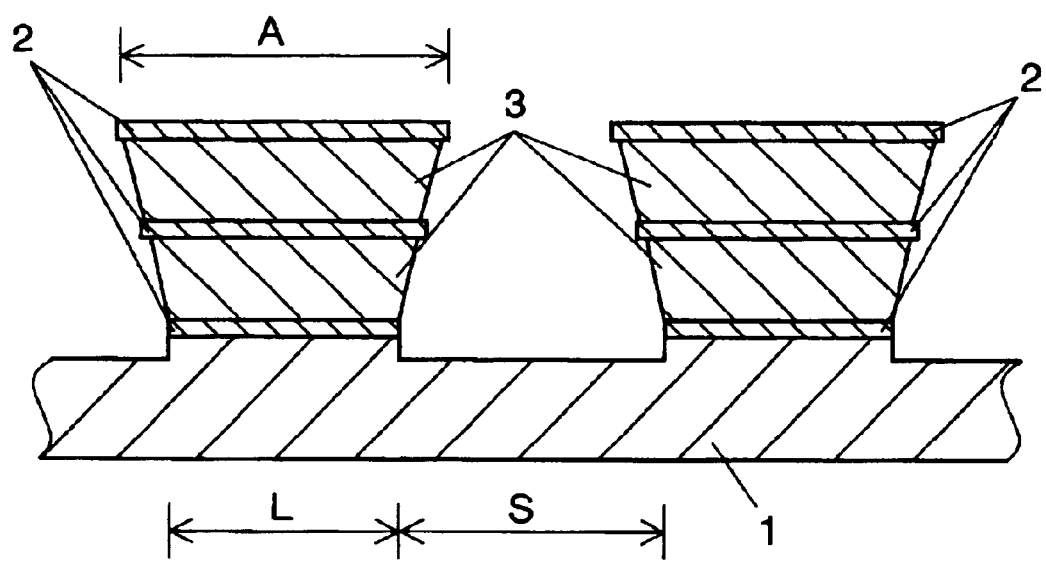
FIG. 4 is an enlarged view of another electrode according to embodiment 1.
Figure 5:
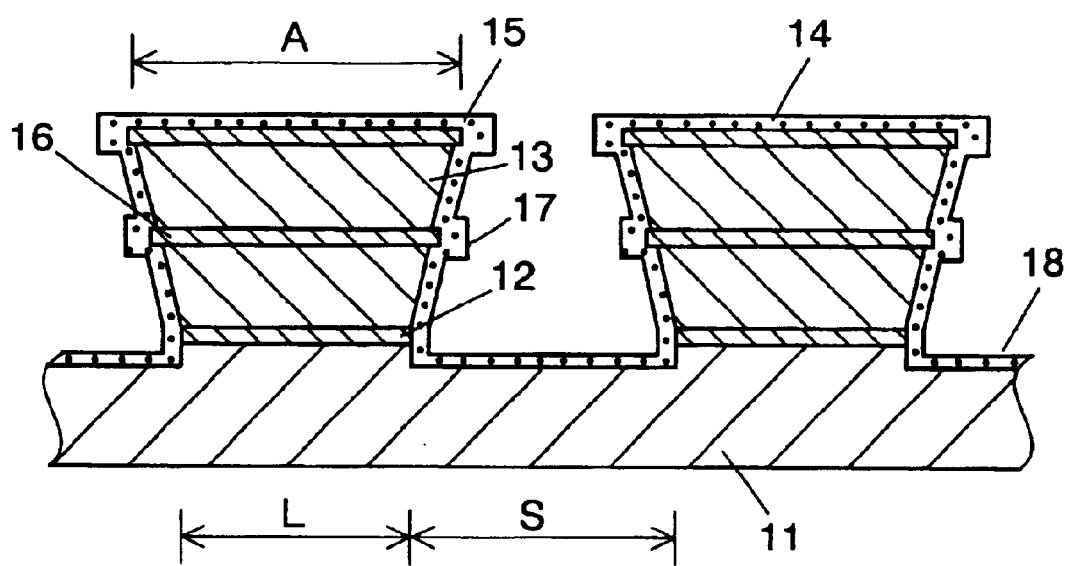
FIG. 5 is an enlarged view of another electrode according to embodiment 1.

FIG. 4 illustrates the cross section of the electrodes arranged of an inverted trapezoid shape having the bottom extending shorter than the top. The shape is implemented by increasing the ratio of the radicals and the heavy ions, such as $BCl_2^+$, in the dry etching ion fluid from 1:1 and loading the piezoelectric substrate with a high-frequency bias of a smaller level, e.g., 40 W. This allows the heavy ions to accelerate the etching for the side surfaces of the electrodes, hence forming an inverted trapezoid shape having the bottom extending shorter than the top. The electrodes of such a shape in the cross section provided on the piezoelectric substrate may be covered with protective layers as shown in FIG. 5.

The electronic apparatus including the surface acoustic wave device 21 according to this embodiment may be combined with a package of a selector switch and a low pass filter constructed from PIN diodes or GaAs semiconductors, hence providing a composite module which has an electronic function of extracting desired frequencies from each transmission or received signal.

(Embodiment 2)

Figure 6:
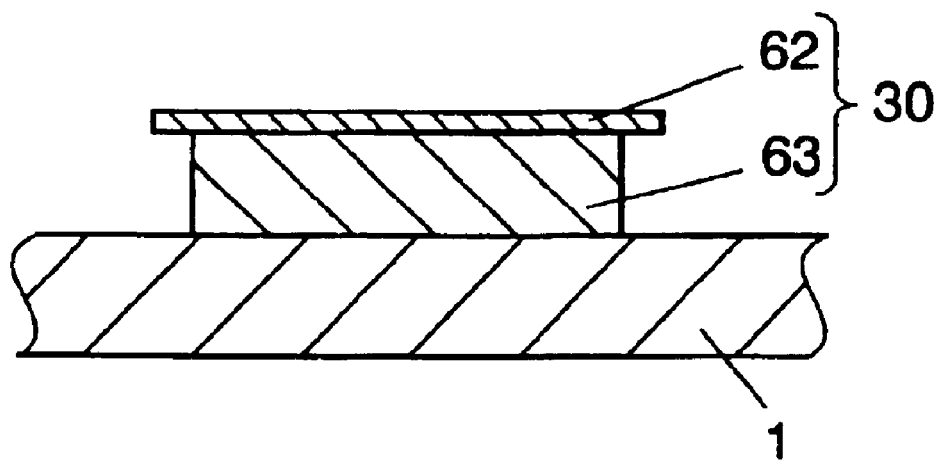
FIG. 6 is a cross sectional view of an electrode of a surface acoustic wave device according to exemplary embodiment 2 of the invention.

FIG. 6 is a cross sectional view of an electrode of a surface acoustic wave device according to exemplary embodiment 2 of the present invention. Like components are denoted by like numerals as those of Embodiment 1 shown in FIG. 1 and will be explained in no more detail.

The surface acoustic wave device of this embodiment includes a piezoelectric substrate 1 and an electrode 30 provided on the piezoelectric substrate 1. The electrode 30 includes a first metal layer 63 having a rectangular shape in the cross section and a second metal layer 62 provided on the first metal layer 63 and having a width greater than that of the first metal layer 63.

The first metal layer 63 and the second metal layer 62 are different in etching rate. More particularly, the etching rate of the first metal layer 63 is greater than that of the second metal layer 62. The etching rate is based on the dry etching process. The first metal layer 63 and the second metal layer 62 may be different from each other in the re-aggregation after vaporization. The first metal layer 63 contains Al while the second metal layer 62 contains either Ti or Ta.

The second metal layer 62 is undulated at the side surfaces less than the first metal layer 63. The side surfaces of the metal layers 62 and 63 are arranged substantially smooth. More specifically, the undulation of each side surface is not greater than 5 nm, similarly to embodiment 1. The interlayer difference between the metal layers 62 and 63 may preferably not exceed 5 nm.

Also, the width (A) of the top and the width (L) of the bottom are preferably arranged so that A/L ranging from 0.98 to 1.01.

The piezoelectric substrate, similarly to embodiment 1, may include etched regions where the electrode is not formed by a depth not greater than 10 nm.

Figure 7:
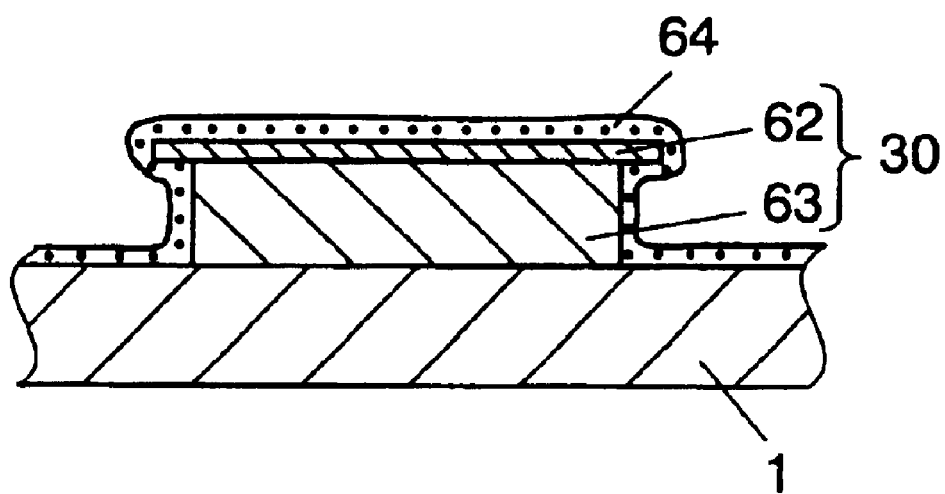
FIG. 7 is a cross sectional view of an electrode of another surface acoustic wave device according to embodiment 2.

The surface acoustic wave device of this embodiment may be covered with a protective layer 64 of insulating material, such as SiO2, as shown in FIG. 7.

It is known that the effect of side etching where lower regions of the electrodes are excessively etched due to charged particles deflected by external electricity is frequently encountered during the dry etching process. According to this embodiment, the dry etching process is preferably controlled by optimizing the operating conditions for eliminating the side etching. As the result, the electrodes can be improved in the smoothness of the side surfaces without creating undesired undulations.

The rectangular shape in the cross section of the electrodes 30 is fabricated by adjusting the ratio between the chloric radicals and the heavy ions, such as $BCl_2^+$ in the dry etching ion fluid to substantially 1:1, and by loading the piezoelectric substrate with a high-frequency bias of a level, for example, 60 W, smaller than that of Embodiment 1. This provides a balance between the spread out of the metal particles and the aggregation of the metal particles at the proximal end close to the piezoelectric substrate of the electrodes during the dry etching, hence allowing the cross section of the electrodes to be arranged of the rectangular shape.

The effect of side etching against the smoothness of the side surfaces of the electrodes 30 is expressed by A/L, where A is the width of the uppermost layer of the electrodes and L is the width of the lowermost layer of the electrode. According to embodiment 2, A/L ranges from 1.000 to 1.002. The A/L may range from 0.98 to 1.01 if desired. When A/L exceeds 1.01, the effect of side etching may appear significantly. Since the electrode 30 has a decreased weight, the surface acoustic wave device can largely vary in the propagation frequency.

If A/L varies not greater than ±0.004 from the center value, the difference in the weight between the electrodes 30 remains small, thus effectively reducing variations in the propagation frequency of the surface acoustic wave device.

As the effect of side etching is effectively attenuated during the dry etching process, the shape and size of the electrodes can be uniform, hence reducing the difference in the weight between the electrodes and thus eliminating variations in the propagation frequency of the surface acoustic wave device 21.

The electrodes 30 and the piezoelectric substrate 1 after fabrication of the electrodes 30 are covered with the protective layers 64 of $SiO_2$ thin film by a sputtering or CVD technique.

By the procedure described above, the electrodes 30 are arranged of a rectangular shape in the cross section of which the side surfaces extend substantially linear and smooth without significant undulations. As the electrodes 30 are made uniform in the shape and size and their difference in the weight is small, the surface acoustic wave device can hardly vary in the propagation frequency. Also, since the electrodes 30 and the piezoelectric substrate 1 are covered with the protective layers 64, they can be protected from short circuit caused by electrically conductive impurities, such as metallic dusts, and thus has s small number of operational failure.

While the protective layers 64 are provided over the electrodes 30 and the piezoelectric substrate 1 according to embodiment 2, they may cover only the electrodes 30. The protective layers 64 may be made from any other insulating material than $SiO_2$.

The electrodes 30 are arranged smooth on the side surfaces, thus reducing interference from each other. As the electrodes are protected from reflection on the side surfaces arranged substantially perpendicular to the piezoelectric substrate, the device can have a desired frequency response.

(Embodiment 3)

Figure 9:
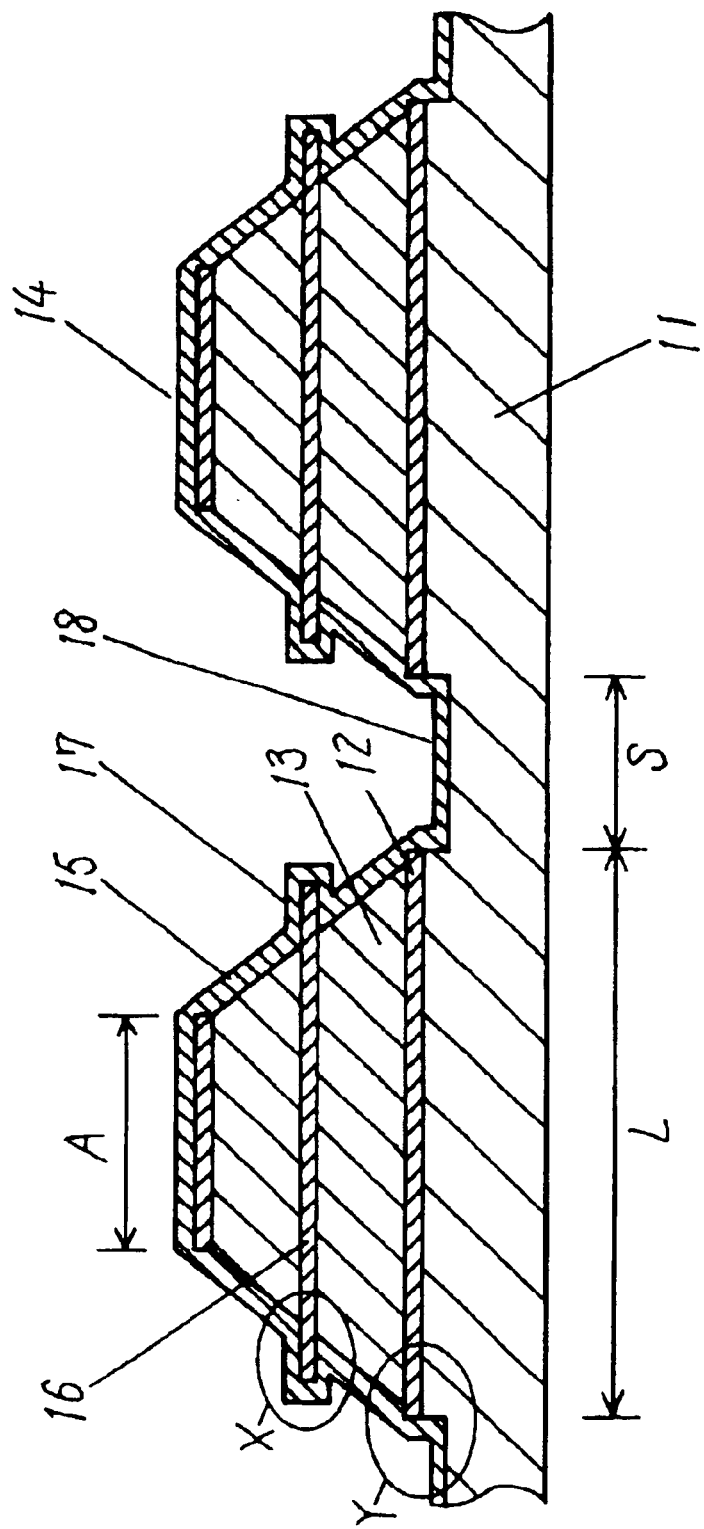
FIG. 9 is a cross sectional view of an electrode of a surface acoustic wave device according to exemplary embodiment 3 of the invention.

FIG. 9 is a cross sectional view of electrodes of a surface acoustic wave device according to exemplary embodiment 3 of the present invention. The surface acoustic wave device includes a piezoelectric substrate 11 made of, e.g., $LiTaO_3$, a first metal layer 12 made of material hardly dry-etched, such as Ti, on the substrate and a second metal layer 13 made of material easily dry-etched, such as Al, deposited alternatively with the layer 12. The layered assembly is then covered with a first metal layer 12 at the top and configured to develop a desired pattern of electrodes 14 by using a photolithography process or the like. The electrodes 14 and the exposed region of the piezoelectric substrate 11 are covered with a protective layer 15 of insulating material, such as silicon carbide.

The cross section of the second metal layer 13 of the electrodes 14 extending perpendicular to the piezoelectric substrate 11 is arranged of a trapezoid shape having the top extending smaller than the bottom. The intermediate layers 16 of the first metal layers 12 excluding the uppermost layer and the lowermost layer in each electrodes 14 extend outwardly from the second metal layers 13 at both side surfaces of the electrode 14.

Each projection 17 of the first metal layer 16 acts as an anchor at respective side surfaces of the electrode 14, thus increasing the bonding strength between the protective layer 15 and the electrode 14, and preventing the protective layer 15 from detachment.

A procedure of fabricating the electrodes 14 will be described.

The first metal layer 12 having a predetermined is first formed on the piezoelectric substrate 11 of a wafer form, such as LiTaO$_3$, by sputtering of appropriate metal, such as Ti.

Then, the second metal layer 13 having a predetermined thickness is formed on the first metal layer 12 by sputtering of an appropriate metal such as Al. The above processes may be repeated to have the first metal layers 12 and the second metal layers 13 placed alternately before finished with the first metal layer 12 at the top.

The first metal layers 12 and the second metal layers 13 may be alternated in any order and modified in the thickness if necessary.

A resist is applied to the metal layers, exposed to light for development through a photo mask with using a stepper, and selectively removed to form a desired pattern of the electrodes 14.

Then, the electrodes 14 are dry-etched to provide comb electrodes, reflector electrodes, and pad electrodes. The dry etching process is performed under such specific operating conditions that the electrodes are configured to a trapezoid shape in the cross section having the bottom extending longer than the top. In particular, the projection 17 of the first metal layer 16 is provided at each side surface of the electrode.

The dry etching may be conducted by an inductively coupled plasma (ICP) method using heavy ions of chloric radical, where the piezoelectric substrate 11 is loaded with a high-frequency bias for etching the electrodes 14 efficiently.

In order to provide the trapezoid shape in the cross section of the electrodes 14 having the bottom extending longer than the top, the ratio between the radicals and the heavy ions are substantially 1:1, and the high-frequency bias to be applied is large. This allows metal particles once spread out to be deposited adjacent to a proximal end of the electrode close to the piezoelectric substrate, hence developing the trapezoid shape of the cross section having the bottom extending longer than the top.

Then, after the remaining resist is removed, the electrodes 14 and the piezoelectric substrate 11 are covered with protective layers 15 of insulating material, such as silicon carbide, by a high-frequency sputtering process or the like. Finally, surface acoustic wave devices 41 are separated with, for example, a dicing machine.

An electronic apparatus 42 is then fabricated with the surface acoustic wave device 41.

Figure 12:
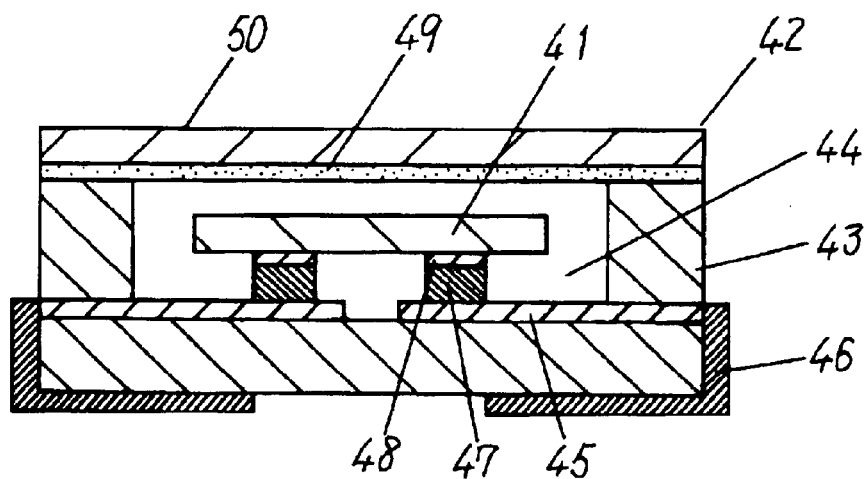
FIG. 12 is a cross sectional view of an electronic apparatus according to embodiment 3.

FIG. 12 is a cross sectional view of the electronic apparatus 42 including the surface acoustic wave device 41. The electronic apparatus 42 includes a base member 43 made of alumina and lead electrodes 45 of gold-plated tungsten material provided on a bottom surface at a center recess 44 of the base member 43. The lead electrodes 45 are connected to terminal electrodes 46 of the gold-plated tungsten material on the outer surfaces of the base member 43, respectively. The surface acoustic wave device 41 is placed with its face down for surface-mounting while electrodes 14 are connected to pad electrodes 48 which are then connected by bumps 47 of gold or the like to the lead electrodes 45. A cover 50 made of alumina and provided with a sheet of adhesive material 49, such as a gold-tin alloy, is placed over the base member 43 and heated under pressure for welding bonded together, and therefore, the surface acoustic wave device 41 is sealed for air tightness.

Alternatively, the surface acoustic wave device 41 may be mounted by any applicable technique, such as wire bonding, if desired. The adhesive material 49 may contain silver, brazing material containing silver, plating material, soldering material, or non-lead soldering. Wirings may be provided in the base member 43 for connecting the bumps to the external terminals.

As the lowermost layer is made of Ti, Ta, Ti alloy, or Ta alloy, the electrodes can be improved in orientation on the piezoelectric substrate 11. Also, the surface acoustic wave device 41 can have an increased withstand power.

As the uppermost layer is made of Ti, Ta, Ti alloy, or Ta alloy, the electrodes can be protected at the outer surface from being injured during the dry etching process. As the electrodes are made uniform in the shape and size and the difference in the mass is minimized, the propagation frequency of the surface acoustic wave device 41 can hardly vary.

Moreover, as the first metal layer at the uppermost is chemically more stable than Al or AL alloy in the layer beneath the uppermost layer, a bonding strength to the protective layer 15 can be improved as well as its durability. Accordingly, the surface acoustic wave device 41 can have particularly an increased withstand power and resistance to moisture.

In order to provide the trapezoid shape in the cross section and the projections 17 of the electrodes 14, the metals or alloys having dry etching rates different from each other are used in a combination. Alternatively, the electrodes 14 may be provided by optimizing the operating conditions for the dry etching process while the metals or alloys are preferably selected in a combination from such metals that particles spread out by the effect of vaporization or electric charging during the dry etching process solidify again easily.

While the second metal layer is made of Al in Embodiment 3 for easy dry etching process, the second metal layer may be made of any other metal or alloy, such as Al—Cu alloy, which can easily be dry-etched. Also, Ti selected as the hardly-dry-etched metal according to the embodiment may be replaced by any other metal or alloy, such as Ta, which can hardly be dry-etched.

Although the protective layer 15 is made of silicon carbide, the layer may be made of silicon oxide, silicon nitride, aluminum oxide, or magnesium oxide.

Figure 10:
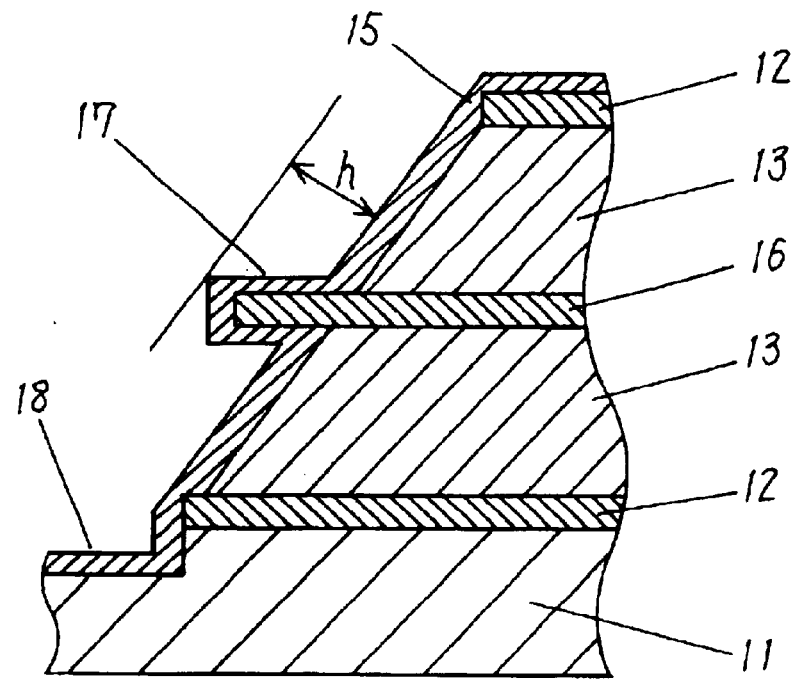
FIG. 10 is an enlarged view of the electrode according to embodiment 3.

FIG. 10 is an enlarged view of a region X of the electrodes 14 in FIG. 9.

The projection 17 extending from each side surface of the electrodes 14 shown in FIG. 10 is defined by an interlayer difference (h) between the distal end of the first metal layer 12 and the exposed end at the electrode side of the second metal layer 13. The interlayer difference (h) is 13 nm according to embodiment 3. The interlayer difference (h) may be not smaller than 7 nm for increasing the bonding strength of the protective layer 15 of the surface acoustic wave device 41.

Meanwhile, the undulation or bump of each side surface of the electrodes 14 is preferably not greater than 5 nm for reducing variations in the propagation frequency of the surface acoustic wave device 41.

The undulation or bump is meaning not only a locally prominent projection or dent but also a wavy surface throughout the sides.

The interlayer difference (h) represents the maximum level appearing different in the size from place to place.

The piezoelectric substrate 11 is dry-etched at portions of the surface where the electrodes 14 are not formed. When the etching in the piezoelectric substrate 11 is too deep, i.e., the electrodes 14 have great thicknesses apparently, the propagation frequency of the surface acoustic wave device 41 may shift to lower and thus varies unnegligibly. Accordingly, the etched depth in the piezoelectric substrate 11 is preferably small.

Figure 11:
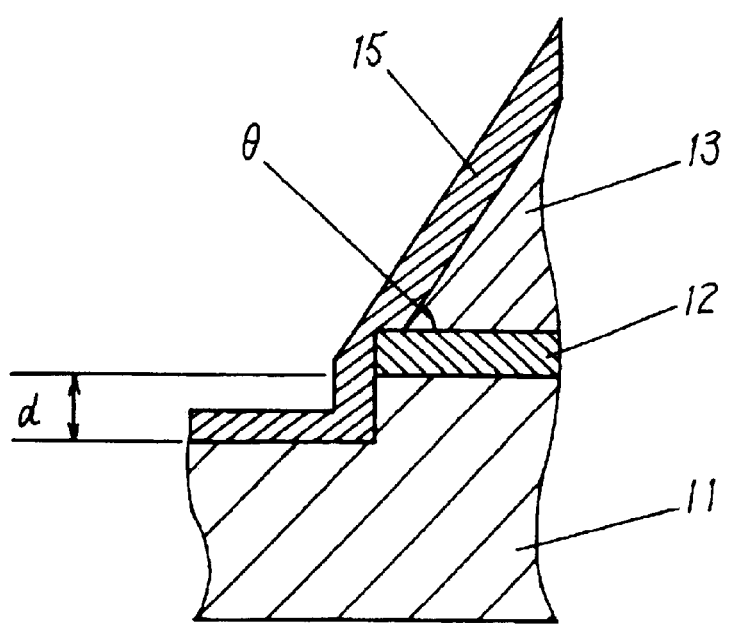
FIG. 11 is an enlarged view of the electrode according to embodiment 3.

FIG. 11 is an enlarged view of a region Y of the electrodes shown in FIG. 9. An etched amount of the piezoelectric substrate 11 is expressed by an etched depth (d), i.e., a distance from the surface of the piezoelectric substrate 11 where the electrodes 14 are provided to the exposed surface of the piezoelectric substrate 11 where the electrodes 14 are not formed. The inclination of each side surface of the electrodes 14 is defined by an angle (θ) between the surface of the piezoelectric substrate 11 which is not etched and the second metal layer 13 on the lowermost layer of the electrodes 14. The etched depth (d) is 5 nm according to embodiment 3 and may be preferably not greater than 10 nm in view of any variation.

If the etched depth (d) is greater than 10 nm, the depth acts as an actual increase of the thickness of the electrodes 14 as the sum of the thickness and the depth and can hardly be negligible. As the result, the propagation frequency of the surface acoustic wave device 41 can shift to lower, thus varying unnegligibly.

The side surfaces of the electrodes 14 may be injured during the dry etching process. The operating conditions for the dry etching process are determined to provide the bottom extending longer than the top of the trapezoid shape of the cross section of the electrodes 14. This protects the electrodes 14 from physical injury during the dry etching process, hence reducing the undulation or bump of each side surface and particularly the uppermost layer of the electrodes 14. Accordingly, as the electrodes 14 are made uniform in the shape and size, their difference in the weight can be reduced, thus eliminating variations in the propagation frequency of the surface acoustic wave device 41.

The inclination angle (θ) of the electrodes 14 shown in FIG. 11 ranges from 73 to 75 degrees according to embodiment 3. The inclination angle (θ) staying within the range allows the electrodes 14 to be uniform in the shape. As the difference in the weight between the electrodes 14 is reduced, the surface acoustic wave device 41 can hardly vary in the propagation frequency. The inclination angle (θ) may range from 70 to 80 degrees in view of any variation. If the inclination angle (θ) is smaller than 70 degrees or greater than 80 degrees, the smoothness of the side surfaces of the electrodes 14 can decline, thus increasing the difference in the weight between the electrodes 14. As the result, the propagation frequency of the surface acoustic wave device 41 can vary significantly.

As shown in FIG. 9, the length (L) of the bottom of the trapezoid shape in the cross section of the electrodes 14 and a distance (S) between the electrodes 14 satisfy that L/(L+S) ranges from 0.59 to 0.61. If L/(L+S) stays in the above range, the electrodes 14 is uniform in the shape and size. Accordingly, as the electrodes 14 are less different in the weight, the surface acoustic wave device 41 can hardly vary in the propagation frequency. L/(L+S) may range from 0.58 to 0.65.

If L/(L+S) is less than 0.58 or greater than 0.65, the smoothness of the side surfaces of the electrodes 14 may decline, hence increasing the difference in the weight between the electrodes 14, and thus, the propagation frequency of the surface acoustic wave device 41 varies.

As shown in FIG. 9, the length (A) of the top of the trapezoid shape in the cross section of the electrodes 14 and the length (L) satisfy that A/L ranges from 0.82 to 0.85. If A/L stays in the above range, the electrodes 14 are uniform in the shape and size. Accordingly, as the electrodes 14 are less different in the weight, the surface acoustic wave device 41 can hardly vary in the propagation frequency.

In the electrodes 14 having the bottom of the trapezoid shape in the cross section extending longer than the top, the controllable range of A/L is preferably from 0.8 to 0.9 with an allowance of ±0.004 from its center value.

When A/L is less than 0.8 or greater than 0.9, the smoothness of the side surfaces of the electrodes 14 can decline, hence increasing the difference in the weight between the electrodes 14, and thus, the propagation frequency of the surface acoustic wave device 41 varies.

Alternatively, in the case that the cross section of the electrodes 14 is arranged of an inverted trapezoid shape having the bottom extending shorter than the top, A/L ranges from 1.1 to 1.3 preferably with an allowance of ±0.004 from its center value.

Also, the electrodes 14 may be shaped symmetrical between the left and the right, hence making the reflection of propagated waves uniform and increasing the accuracy of their shape. Accordingly, the propagation frequency of the surface acoustic wave device 41 can hardly vary.

If the interlayer distance (h) of the projection 17 is identical at each of two, left and right, side surfaces, an adhesive strength of the protective layer 15 to the first metal layer 12 and the second metal layer 13 is balanced between both side surfaces of the electrodes 14, thus increasing the bonding strength between the layers.

The electrodes 14 of embodiment 3 are fabricated from a layered assembly of the metals having dry etching rates different from each other. This allows the first metal layers 12 being hardly etched to be arranged to a rectangular shape in the cross section, and the second metal layers 13 being easily etched to be arranged to a trapezoid shape in the cross section having the bottom extending longer than the top. However, each side surface of the electrodes 14 is substantially smoothed since having undesired undulations. Accordingly, the electrodes 14 are uniform in the shape and size and their difference in the weight is reduced, thus allowing the surface acoustic wave device 41 to be hardly vary the propagation frequency.

In the case that the trapezoid shape in the cross section of the electrodes 14 has the bottom extending shorter than the top, the bonding strength of the protective layer 15 to the electrodes 14 can further be increased. The shape is implemented by increasing the ratio between the radicals and the heavy ions in the dry etching ion fluid and loading the piezoelectric substrate 11 with the high-frequency bias of a smaller level. This allows the heavy ions to accelerate the etching against the side surfaces of the electrodes 14, hence forming the inverted trapezoid shape having the bottom extending shorter than the top.

The surface acoustic wave device 41 of this embodiment may be combined with a package of a selector switch and a low pass filter constructed from PIN diodes or GaAs semiconductors, hence providing an electronic apparatus for a composite module. Since including the electronic apparatus has an electronic function of extracting desired frequencies from each transmission or received signal, the composite module can thus be utilized for both transmission and reception of signals.

(Embodiment 4)

Figure 13:
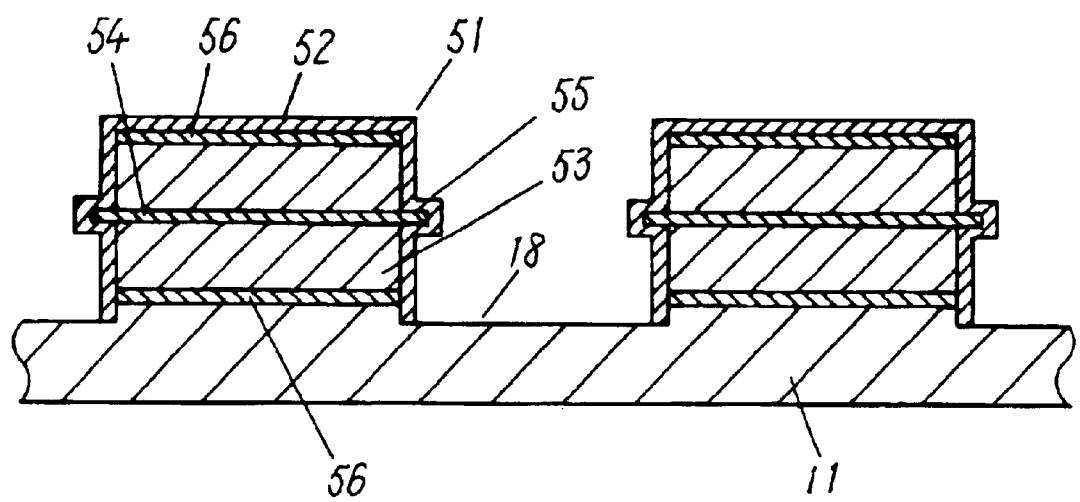
FIG. 13 is a cross sectional view of an electrode of a surface acoustic wave device according to exemplary embodiment 4 of the invention.
Figure 14:
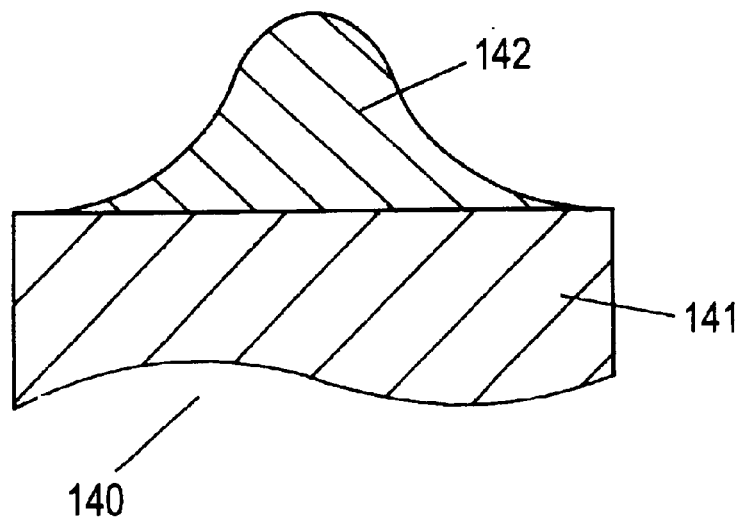
FIG. 14 is a cross sectional view of an electrode of a conventional surface acoustic wave device.
Figure 15:
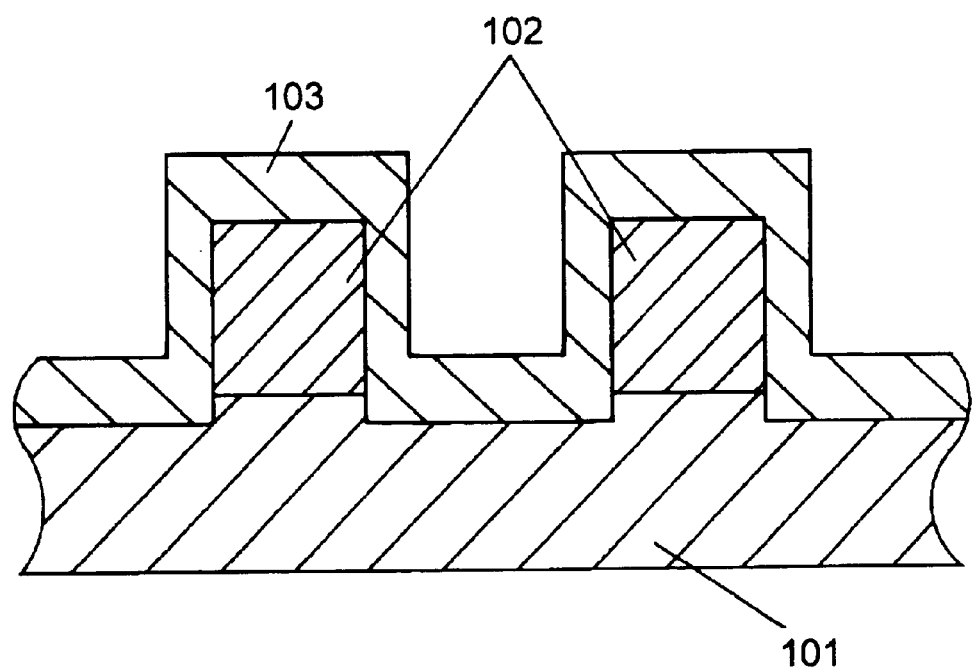
FIG. 15 is a cross sectional view of an electrode of another conventional surface acoustic wave device.

FIG. 13 is a cross sectional view of the electrodes of a surface acoustic wave device showing Embodiment 4 of the present invention. Like components are denoted by like numerals as those of Embodiment 3 shown in FIG. 9 and will be explained in no more detail.

Embodiment 4 is differentiated from Embodiment 3 by the shape in the cross section of electrodes 51 as well as the material and extension of a protective layer 52 provided on the electrodes 51. While its other arrangement is identical to that of Embodiment 3, the surface acoustic wave device is provided for constructing an electronic apparatus and a composite module.

The cross section of the electrodes 14 of Embodiment 3 is arranged of a trapezoid shape having the bottom extended longer than the top while the first metal layer 16 in an intermediate of the shape in the cross section of the electrodes 14 is extended outwardly from each side surface of the electrodes 14. Also, the protective layer 15 is made of silicon carbide and arranged to cover the electrodes 14 and the piezoelectric substrate 11.

In particular, the cross section of the electrodes 51 of Embodiment 4 is arranged of a rectangular shape including a fourth metal layer 53 made of a metal or alloy which can easily be dry etched. A third metal layer 54 is made of a metal or alloy which can hardly be dry etched, provided in an intermediate of the shape in the cross section of the electrodes 51, and arranged to extend at each end outwardly from the electrodes 51. The protective layer 52 is made of silicon oxide and arranged to cover the upper and side surfaces of the electrodes 51.

The interlayer difference (h) of embodiment 4 is 10 nm. In order to increasing the bonding strength of the protective layer 52 in the surface acoustic wave device 41, the interlayer difference (h) may be not smaller than 7 nm. A projection 55 of the third metal layer 54 serves as an anchor, thus improving the bonding strength of the protective layer 52 to the electrodes 51. Also, as a contact area between the protective layer 52 and the electrodes 51 increases, the bonding strength can further be improved.

The undulation of each side surface of the electrodes 51 is not greater than 5 nm for reducing variations in the propagation frequency of the surface acoustic wave device 41.

The effect of side etching where lower end regions of the electrodes 51 adjacent to the piezoelectric substrate 11 are excessively etched due to charged particles deflected by external electricity is frequently encountered during the dry etching process. According to this embodiment, the dry etching process is preferably controlled by optimizing the operating conditions for eliminating the side etching, thus reducing undulations of the side surfaces of the electrodes 51 and increasing the smoothness of the surfaces.

The rectangular shape in the cross section of the forth metal layer 53 is fabricated by adjusting the ratio between the charged radicals and the ions to substantially 1:1 and by loading the piezoelectric substrate with the high-frequency bias of a smaller level than that of Embodiment 1. This provides a balance between metal particles spread out and metal particles aggregating at the proximal end close to the piezoelectric substrate of the electrodes during the etching process, hence allowing the cross section of the electrodes 51 to be arranged of the rectangular shape.

The effect of side etching against the smoothness of the side surfaces of the electrodes 51 is expressed by A/L where A is the width of the uppermost layer of the electrodes 51 and L is the width of the lowermost layer of the same. In Embodiment 4, A/L ranges from 1.000 to 1.002. The range may extend from 0.98 to 1.01 if desired.

When A/L exceeds 1.01, the effect of side etching may appear significantly. As the electrodes 51 has decreased weights, the surface acoustic wave device can largely vary in the propagation frequency.

If A/L ranging 0.98 to 1.01 varies not greater than ±0.004 from its center value, the difference in weight between the electrodes 51 remains small, thus effectively reducing variations in the propagation frequency of the surface acoustic wave device. As the effect of side etching is effectively attenuated during the dry etching process, the shape and size of the electrodes 51 can be uniform, hence reducing the difference in the weight between the electrodes 51 and thus eliminating variations in the propagation frequency of the surface acoustic wave device 41.

The electrodes 51 after their fabrication are covered at the upper and side surfaces with the protective layers 52 of silicon oxide thin film by masking the other area than the electrodes 51 with a resist and subjecting to sputtering or CVD process.

By the procedure described above, the electrodes 51 are arranged of a rectangular shape in the cross section having side surfaces with reduced undulation. This prevents the electrodes 51 from varying in the size and weight. The third metal layers 54 extending outwardly from the side surfaces of the electrodes 51 allows the electrodes 51 to be covered at the upper and side surfaces with the protective layers 52. Accordingly, the electrodes 51 can be protected from short circuit caused by electrically conductive impurities, such as metallic dusts deposited thereon, thus contributing to reduction of operational failure of the surface acoustic wave device.

The surface acoustic wave device fabricated by the foregoing procedure may be used for constructing an electronic apparatus and a composite module.

While the protective layers 52 are provided over the upper and side surfaces of the electrodes 51 according to embodiment 4, the layers may cover the piezoelectric substrate 11 as well as the electrodes 51.

Also, the protective layers 52 are not limited to the silicon oxide layer but may be made from any other insulating material, such as silicon nitride, silicon carbide, aluminum oxide, aluminum nitride, or magnesium oxide.

The electrodes 51 are arranged smooth on the side surfaces so as to reduce interference from each other. Since the electrodes 51 are protected from reflection of surface acoustic waves on the side surfaces arranged substantially perpendicular to the piezoelectric substrate, the device can provide a desired frequency response.

The surface acoustic wave device of embodiment 3 and 4, similarly to that of embodiment 1, may construct an electronic apparatus and a high-frequency module.

INDUSTRIAL APPLICABILITY

According to the present invention, a surface acoustic wave device and an electronic apparatus including the device does not vary in a propagation frequency.

What is claimed is:

1. A surface acoustic wave device comprising:
   a piezoelectric substrate; and
   an electrode including
      a first metal layer provided on said piezoelectric substrate and having a trapezoid shape in a cross section, and
      a second metal layer provided over said piezoelectric substrate at a same position as said first metal layer,
   wherein said piezoelectric substrate is etched to a depth not greater than 10 nm at a portion where said electrode is not formed thereon.

2. The surface acoustic wave device according to claim 1, wherein said first metal layer and said second metal layer are different from each other in etching rate.

3. The surface acoustic wave device according to claim 2, wherein said first metal layer has an etching rate greater than said second metal layer.

4. The surface acoustic wave device according to claim 2, wherein said etching rate is based on a dry etching process.

5. The surface acoustic wave device according to claim 1, wherein said first metal layer and said second metal layer are different from each other in re-aggregation after vaporization.

6. The surface acoustic wave device according to claim 1, wherein said first metal layer contains Al, and said second metal layer contains one of Ti and Ta.

7. The surface acoustic wave device according to claim 1, wherein said second metal layer is located between said first metal layer and said piezoelectric substrate.

8. The surface acoustic wave device according to claim 1, wherein said second metal layer is located on said first metal layer.

9. The surface acoustic wave device according to claim 8, wherein said second metal layer is an uppermost layer of said electrode.

10. The surface acoustic wave device according to claim 1, wherein a side surface of said second metal layer has an undulation smaller than a side surface of said first metal layer.

11. The surface acoustic wave device according to claim 1, wherein said electrode has a side surface thereof arranged substantially smooth.

12. The surface acoustic wave device according to claim 1, wherein a side surface of said electrode has an undulation not greater than 5 nm.

13. The surface acoustic wave device according to claim 1, wherein an inclination angle of a side surface of said electrode ranges from 70 to 80 degrees.

14. The surface acoustic wave device according to claim 1, wherein an interlayer difference between respective side surfaces of said first metal layer and said second metal layer is not greater than 5 nm.

15. The surface acoustic wave device according to claim 1, further comprising
another electrode provided on said piezoelectric substrate,
wherein a width (L) of a lowermost of said electrode is L and a distance (S) between said electrode and said another electrode satisfy that L/(L+S) ranges from 0.58 to 0.65.

16. The surface acoustic wave device according to claim 1, wherein a width (A) of an uppermost of said electrode farthest from said piezoelectric substrate and a width (L) of a lowermost of said electrode closest to said piezoelectric substrate satisfy that A/L ranges from 0.8 to 0.9.

17. The surface acoustic wave device according to claim 1, wherein a width (A) of an uppermost of said electrode farthest from said piezoelectric substrate and a width (L) of a lowermost of said electrode closest to said piezoelectric substrate satisfy that A/L ranges from 1.1 to 1.3.

18. The surface acoustic wave device according to claim 1, wherein a shape of a cross section of said electrode is symmetrical from left to right.

19. The surface acoustic wave device according to claim 1, further comprising
a protective layer for covering at least said electrode.

20. The surface acoustic wave device according to claim 19, wherein said protective layer has an insulating property.

21. A surface acoustic wave device comprising:
a piezoelectric substrate; and
an electrode including
a first metal layer provided over said piezoelectric substrate and having a cross section of a rectangular shape, and
a second metal layer provided over said first metal layer and being wider than said first metal layer,
wherein a side surface of said second metal layer has an undulation smaller than a side surface of said first metal layer.

22. The surface acoustic wave device according to claim 21, wherein a width (A) of an uppermost of said electrode and a width (L) of a lowermost of said electrode satisfy that A/L ranges from 0.98 to 1.01.

23. A surface acoustic wave device comprising:
a piezoelectric substrate; and
an electrode including
a first metal layer provided over said piezoelectric substrate and having a cross section of a rectangular shape, and
second metal layer provided over said first metal layer and being wider than said first metal layer,
wherein said piezoelectric substrate has a portion etched to a depth not greater than 10 nm where said electrode is not formed thereon.

24. The surface acoustic wave device according to claim 23, wherein said first metal layer and said second metal layer are different from each other in etching rate.

25. The surface acoustic wave device according to claim 24, wherein said first metal layer has an etching rate greater than said second metal layer.

26. The surface acoustic wave device according to claim 24, wherein said etching rate is based on an dry etching process.

27. The surface acoustic wave device according to claim 23, wherein said first metal layer and said second metal layer are different from each other in re-aggregation after vaporization.

28. The surface acoustic wave device according to claim 23, wherein said first metal layer contains Al, and said second metal layer contains one of Ti and Ta.

29. The surface acoustic wave device according to claim 23, further comprising
another electrode provided on said piezoelectric substrate,
wherein a width (L) of a lowermost of said electrode and a distance (S) between said electrodes and said another electrode satisfy that L/(L+S) ranges from 0.58 to 0.65.

30. The surface acoustic wave device according to claim 23, further comprising
a protective layer for covering at least said electrode.

31. The surface acoustic wave device according to claim 30, wherein said protective layer has an insulating property.

32. A surface acoustic wave device comprising:
a piezoelectric substrate; and
an electrode including
a first metal layer provided over said piezoelectric substrate and having a cross section of a rectangular shape, and
a second metal layer provided over said first metal layer and being wider than said first metal layer,
wherein a side surface of said electrode has an undulation not greater than 5 nm.

33. A surface acoustic wave device comprising:
a piezoelectric substrate; and
an electrode including
a first metal layer provided over said piezoelectric substrate and having a cross section of a rectangular shape, and
a second metal layer provided over said first metal layer and being wider than said first metal layer,
wherein a interlayer difference between respective side surfaces of said first metal layer and said second metal layer is not greater than 5 nm.

34. A surface acoustic wave device comprising:
a piezoelectric substrate; and
an electrode including
a first metal layer provided over said piezoelectric substrate and having a cross section of a rectangular shape, and
a second metal layer provided over said first metal layer and being wider than said first metal layer,
wherein a width (A) of an uppermost of said electrode distanced farthest from said piezoelectric substrate and a width (L) of a lowermost of said electrode closest to said piezoelectric substrate satisfy that A/L ranges from 0.98 to 1.01.

35. A surface acoustic wave device comprising:
a piezoelectric substrate
an electrode provided on said piezoelectric substrate and having a projection provided on a side surface thereof, said electrode including
a first metal layer, and
a second metal layer provided on said first metal layer;
a protective layer for covering at least an upper surface and said side surface of said electrode; and
a third metal layer provided between said first metal layer and said piezoelectric substrate.

36. The surface acoustic wave device according to claim 35, wherein said third metal layer is a lowermost layer of said electrode and contains one of Ti and Ta.

37. A surface acoustic wave device comprising:
a piezoelectric substrate;
an electrode including
a first metal layer provided on said piezoelectric substrate and having a trapezoid shape in a cross section, and
a second metal layer provided over said piezoelectric substrate at a same position as said first metal layer; and
another electrode provided on said piezoelectric substrate,
wherein a width (L) of a lowermost of said electrode is L and a distance (S) between said electrode and said another electrode satisfy that L/(L+S) ranges from 0.58 to 0.65.

38. A surface acoustic wave device comprising:
a piezoelectric substrate; and
an electrode including
a first metal layer provided on said piezoelectric substrate and having a trapezoid shape in a cross section, and
a second metal layer provided over said piezoelectric substrate at a same position as said first metal layer,
wherein a width (A) of an uppermost of said electrode farthest from said piezoelectric substrate and a width (L) of a lowermost of said electrode closest to said piezoelectric substrate satisfy that A/L ranges from 1.1 to 1.3.

39. A surface acoustic wave device comprising:
a piezoelectric substrate;
an electrode provided on said piezoelectric substrate and having a projection provided on a side surface thereof, said electrode including
a first metal layer, and
a second metal layer provided on said first metal layer; and
a protective layer for covering at least an upper surface and said side surface of said electrode,
wherein a cross section of said first metal layer has a trapezoid shape.

40. The surface acoustic wave device according to claim 39, wherein said first metal layer and said second metal layer are different from each other in etching rate.

41. The surface acoustic wave device according to claim 40, wherein said first metal layer has an etching rate greater than said second metal layer.

42. The surface acoustic wave device according to claim 39, wherein a side surface of said second metal layer extends outwardly of a side surface of said first metal layer so as to form said projection.

43. The surface acoustic wave device according to claim 39, wherein said first metal layer contains Al.

44. The surface acoustic wave device according to claim 39, wherein said second metal layer contains one of Ti and Ta.

45. The surface acoustic wave device according to claim 39, wherein said second metal layer is an uppermost layer of said electrode.

46. The surface acoustic wave device according to claim 39, wherein a cross section of said second metal layer has a rectangular shape.

47. The surface acoustic wave device according to claim 39, wherein said protective layer has an insulating property.

48. The surface acoustic wave device according to claim 47, wherein said protective layer is made of material selected from a group consisting of silicon oxide, silicon nitride, silicon carbide, aluminum oxide, aluminum nitride, and magnesium oxide.

49. A surface acoustic wave device comprising:
a piezoelectric substrate; and
an electrode including
a first metal layer provided on said piezoelectric substrate and having a trapezoid shape in a cross section, and
a second metal layer provided over said piezoelectric substrate at a same position as said first metal layer,
wherein a side surface of said second metal layer has an undulation smaller than a side surface of said first metal layer.

50. A surface acoustic wave device comprising:
a piezoelectric substrate; and
an electrode including
a first metal layer provided on said piezoelectric substrate and having a trapezoid shape in a cross section, and
a second metal layer provided over said piezoelectric substrate at a same position as said first metal layer
wherein a side surface of said electrode has an undulation not greater than 5 nm.

51. A surface acoustic wave device comprising:
a piezoelectric substrate; and
an electrode including
a first metal layer provided on said piezoelectric substrate and having a trapezoid shape in a cross section, and
a second metal layer provided over said piezoelectric substrate at a same position as said first metal layer,
wherein an interlayer difference between respective side surfaces of said first metal layer and said second metal layer is not greater than 5 nm.

52. An electronic apparatus comprising:
said surface acoustic wave device according to claim 1, 32, or 45;
a mounting member for accommodating said surface acoustic wave device; and
a connector provided at said surface acoustic wave device for electrically connecting said surface acoustic wave device with said mounting member.

53. The electronic apparatus according to claim 52, wherein said connector includes a bump provided on said surface acoustic wave device.

54. The electronic apparatus according to claim 52, wherein said connector includes a wire provided between said surface acoustic wave device and said mounting member.

55. The electronic apparatus according to claim 52, wherein said mounting member is a platform or a package.

56. A composite module comprising:
said surface acoustic wave device according to claim 1, 32, or 45;

a circuit connected to said surface acoustic wave device; and a mounting member having said circuit therein and having said surface acoustic wave device mounted thereto.

57. The composite module according to claim 56, wherein said mounting member is a platform.

* * * * *